United States Patent
Hwang

(10) Patent No.: US 8,293,633 B2
(45) Date of Patent: Oct. 23, 2012

(54) METHOD OF MANUFACTURING NONVOLATILE MEMORY DEVICE

(75) Inventor: Sun Kak Hwang, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 139 days.

(21) Appl. No.: 12/793,215

(22) Filed: Jun. 3, 2010

(65) Prior Publication Data

US 2010/0311232 A1 Dec. 9, 2010

(30) Foreign Application Priority Data

Jun. 8, 2009 (KR) .................. 10-2009-0050450

(51) Int. Cl.
*H01L 21/3205* (2006.01)
(52) U.S. Cl. ........ 438/591; 438/592; 438/593; 438/594; 257/E21.21; 257/E21.209
(58) Field of Classification Search .................. None
See application file for complete search history.

(56) References Cited

U.S. PATENT DOCUMENTS

| | | | | |
|---|---|---|---|---|
| 5,894,037 | A * | 4/1999 | Kikuchi et al. | 427/372.2 |
| 6,008,515 | A * | 12/1999 | Hsia et al. | 257/309 |
| 6,107,169 | A | 8/2000 | Park | |
| 2003/0183869 | A1 | 10/2003 | Crivelli et al. | |
| 2007/0026655 | A1* | 2/2007 | Kim et al. | 438/594 |
| 2008/0150009 | A1* | 6/2008 | Chen | 257/325 |

FOREIGN PATENT DOCUMENTS

| KR | 10-2007-0050512 | 5/2007 |
|---|---|---|
| KR | 10-2008-0001158 | 1/2008 |

* cited by examiner

*Primary Examiner* — Charles Garber
*Assistant Examiner* — Yasser Abdelaziez
(74) *Attorney, Agent, or Firm* — Marshall, Gerstein & Borun LLP

(57) ABSTRACT

A method of manufacturing a nonvolatile memory device comprises providing a semiconductor substrate defining active regions and isolation regions with a gate insulating layer and a floating gate formed over each active region and isolation layer formed in the respective isolation regions, forming a dielectric layer on a surface of the isolation layers and the floating gates, forming a polysilicon layer over the dielectric layer through a polysilicon deposition process using a nitrogen source gas, a silicon source gas, and an impurity doping gas, and patterning the polysilicon layer to form a control gate.

17 Claims, 2 Drawing Sheets

METHOD OF MANUFACTURING NONVOLATILE MEMORY DEVICE

CROSS-REFERENCE TO RELATED APPLICATION

Priority to Korean patent application number 10-2009-0050450 filed on Jun. 8, 2009, the entire disclosure of which is incorporated by reference herein, is claimed.

BACKGROUND

Exemplary embodiments relate generally to a method of manufacturing a nonvolatile memory device and, more particularly, to a method of manufacturing a nonvolatile memory device, which is capable of reducing the grain size of a control gate.

A nonvolatile memory device includes a number of memory cells for storing data. A NAND flash memory cell is described as an example. The NAND flash memory cell has a stack structure, including a gate insulating layer for electron tunneling, a floating gate for storing data, a dielectric layer for coupling, and a control gate for transferring a driving voltage.

With the gradual increase in the degree of integration of nonvolatile memory devices, sizes of memory cell have been reduced and therefore the gap between neighboring memory cells has been narrowed. In particular, with a reduction in the gap between the memory cells, a process of forming the control gate has gradually become difficult. More particularly, to form the control gate, polysilicon is grown and formed on the dielectric layer. If the grain size of polysilicon is large and uniform, a void can be generated between the grains. The voids generated in the control gate can lead to a difference in the electrical properties between different memory cells when the memory cells are operated. Furthermore, since the voids generated in the control gate can be thermally moved, the coupling ratio of a corresponding memory cell is lowered if the voids adhere to the dielectric layer. If an abnormal cell occurs as described above, the distribution characteristics of the nonvolatile memory device deteriorate.

BRIEF SUMMARY

In accordance with exemplary embodiments of this disclosure, an increase in the grain size of a control gate can be inhibited by supplying a nitrogen source gas in a process of forming the control gate.

A method of manufacturing a nonvolatile memory device according to an aspect of the disclosure comprises providing a semiconductor substrate defining active regions and isolation regions with a gate insulating layer and a floating gate formed over each active region and isolation layer formed in the respective isolation regions, forming a dielectric layer on a surface of the isolation layers and the floating gates, forming a polysilicon layer over the dielectric layer through a polysilicon deposition process using a nitrogen source gas, a silicon source gas, and an impurity doping gas, and patterning the polysilicon layer to form a control gate.

Preferably, a process of forming the dielectric layer and the polysilicon deposition process are performed in-situ.

The nitrogen source gas preferably is selected from the group consisting of $NH_3$ gas, $N_2O$ gas, and NO gas, the silicon source gas preferably is selected from the group consisting of $SiH_4$ gas, $Si_2H_6$ gas, and $Si_3H_8$ gas, and the impurity doping gas preferably comprises $PH_3$ gas.

The polysilicon deposition process preferably is performed by supplying the nitrogen source gas at the flow rate of 0.1 sccm to 5.0 sccm, supplying the silicon source gas at the flow rate of 10 sccm to 500 sccm, and supplying the impurity doping gas at the flow rate of 10 sccm to 500 sccm at a pressure in a range 10 Torr to 60 Torr and a temperature in a range of 500° C. to 900° C.

The dielectric layer preferably has an ONO stack structure of an oxide layer, a nitride layer, and an oxide layer.

The method preferably further comprises nitrifying a surface of the dielectric layer through a thermal nitrification process using the nitrogen source gas after forming the dielectric layer.

The nitrogen source gas preferably is selected from the group consisting of $NH_3$ gas, $N_2O$ gas, and NO gas.

The thermal nitrification process preferably is performed by supplying the nitrogen source gas at the flow rate of 0.1 sccm to 5.0 sccm for 10 seconds to 1000 seconds at a pressure in a range of 10 Torr to 60 Torr and a temperature in a range of 500° C. to 900° C.

A process of forming the dielectric layer, the thermal nitrification process, and the polysilicon deposition process preferably are performed in-situ.

The method further preferably comprises forming a silicon seed layer on a surface of the dielectric layer using the nitrogen source gas and the silicon source gas prior to performing the polysilicon deposition process.

A process of forming the dielectric layer, a process of forming the silicon seed layer, and the polysilicon deposition process preferably are performed in-situ.

The nitrogen source gas preferably is selected from the group consisting of $NH_3$ gas, $N_2O$ gas, and NO gas, and the silicon source gas preferably is selected from the group consisting of $SiH_4$ gas, $Si_2H_6$ gas, and $Si_3H_8$ gas.

A process of forming the silicon seed layer preferably is performed by supplying the nitrogen source gas at the flow rate of 0.1 sccm to 5.0 sccm and the silicon source gas at the flow rate of 1 sccm to 100 sccm at a temperature in a range of 500° C. to 900° C. and a pressure in a range of 10 Torr to 60 Torr.

A method of manufacturing a nonvolatile memory device according to another aspect of the disclosure comprises forming isolation layers in a semiconductor substrate, sequentially forming a gate insulating layer, a charge trap layer, and a charge cut-off layer over the semiconductor substrate including the isolation layers, nitrifying a surface of the charge cut-off layer through a thermal nitrification process using a nitrogen source gas, forming a polysilicon layer over the nitrified charge cut-off layer through a polysilicon deposition process using the nitrogen source gas, a silicon source gas, and an impurity doping gas, and patterning the polysilicon layer to form a control gate.

The charge trap layer preferably comprises a nitride, and the charge cut-off layer preferably comprises a material selected from the group consisting of $Al_2O_3$, $HfO_2$, and $ZrO_2$ or has a stack structure including at least two of $Al_2O_3$, $HfO_2$, and $ZrO_2$.

The nitrogen source gas preferably is selected from the group consisting of $NH_3$ gas, $N_2O$ gas, and NO gas, the silicon source gas preferably is selected from the group consisting of $SiH_4$ gas, $Si_2H_6$ gas, and $Si_3H_8$ gas, and the impurity doping gas preferably comprises $PH_3$ gas.

The thermal nitrification process preferably is performed by supplying the nitrogen source gas at the flow rate of 0.1 sccm to 5.0 sccm for 10 to 1000 seconds at a temperature in a range of 500° C. to 900° C. and a pressure in a range of 10 Torr to 60 Torr.

The polysilicon deposition process preferably is performed by supplying the nitrogen source gas at the flow rate of 0.1 sccm to 5.0 sccm and the silicon source gas at the flow rate of 10 sccm to 500 sccm at a temperature in a range of 500° C. to 900° C. and a pressure in a range of 10 Torr to 60 Torr.

The method preferably further comprises forming a silicon seed layer on a surface of the nitrified charge cut-off layer using the nitrogen source gas and the silicon source gas prior to the polysilicon deposition process.

The silicon seed layer preferably is formed by supplying a nitrogen source gas selected from the group consisting of $NH_3$ gas, $N_2O$ gas, and NO gas at a flow rate of 0.1 sccm to 5.0 sccm and a silicon source gas selected from the group consisting of $SiH_4$ gas, $Si_2H_6$ gas, and $Si_3H_8$ gas at a flow rate of 1 sccm to 100 sccm at a temperature in a range of 500° C. to 900° C. and a pressure in a range of 10 Torr to 60 Torr.

DESCRIPTION OF EMBODIMENTS

Figure 1A:
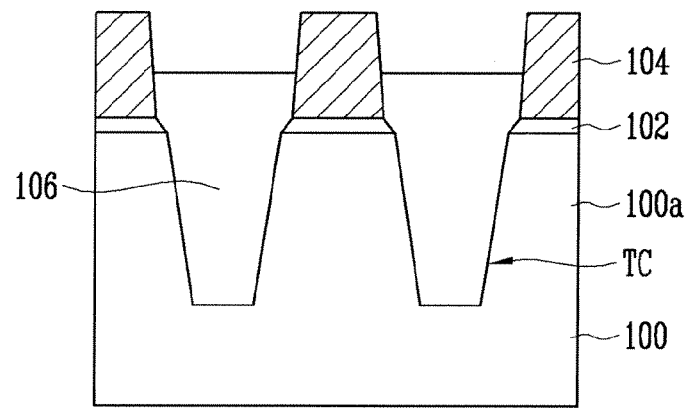
FIGS. 1A to 1D are cross-sectional views illustrating a method of manufacturing a nonvolatile memory device according to an exemplary embodiment of this disclosure.

Hereinafter, exemplary embodiments of the disclosure are described in detail with reference to the accompanying drawings. The drawing figures are provided to allow those having ordinary skill in the art to understand the scope of the embodiments of the disclosure.

FIGS. 1A to 1D are cross-sectional views illustrating a method of manufacturing a nonvolatile memory device according to a first exemplary embodiment of this disclosure.

Referring to FIG. 1A, a gate insulating layer 102 for electron tunneling and a conductive layer 104 for a floating gate are formed over a semiconductor substrate 100. The gate insulating layer 102 preferably comprises an oxide layer. The conductive layer 104 preferably comprises a doped polysilicon layer or a stack structure of an undoped polysilicon layer and a doped polysilicon layer. An isolation mask pattern (not shown) for defining isolation regions is formed on the conductive layer 104. The conductive layer 104 and the gate insulating layer 102 are patterned using the isolation mask pattern. Part of the exposed semiconductor substrate 100 is etched to form trenches TC. Consequently, the gate insulating layer 102 and the floating gate 104 are formed over the active region 100a of the semiconductor substrate 100. The trenches TC are filled with insulating materials to form isolation layers 106 in the respective trenches. The isolation mask pattern is then removed. The isolation layers 106 preferably comprise an oxide layer. The isolation layers 106 preferably are formed by forming a spin on glass (SOG) layer (i.e., a fluid layer), performing a densification process for the SOG layer, and stacking a high density plasma (HDP) layer, having a higher density than the fluid layer, on the fluid layer in order to prevent voids from occurring. The height of the isolation layers 106 preferably is lowered by performing an etch process to control an effective field height (EFH), but the gate insulating layer 102 is not exposed. Before the formation of the isolation layers 106, a liner insulating layer (e.g., an oxide layer) may be further formed on the entire surface of the trenches TC.

Figure 1B:
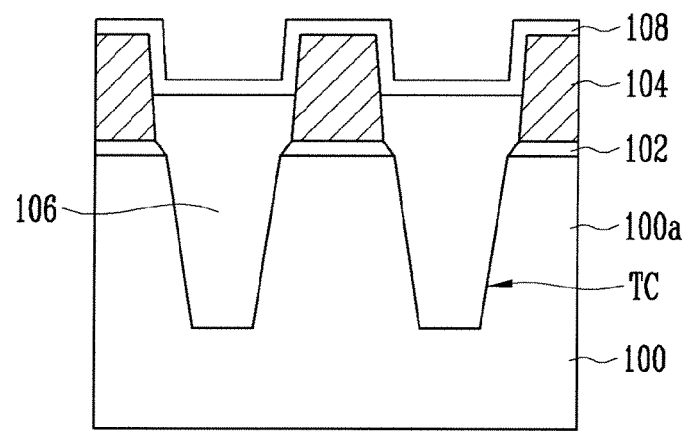

Referring to FIG. 1B, a dielectric layer 108 is formed on the isolation layers 106 and an exposed surface of the floating gate 104. The dielectric layer 108 preferably has an ONO structure having a stack of an oxide layer, a nitride layer, and an oxide layer.

Figure 1C:
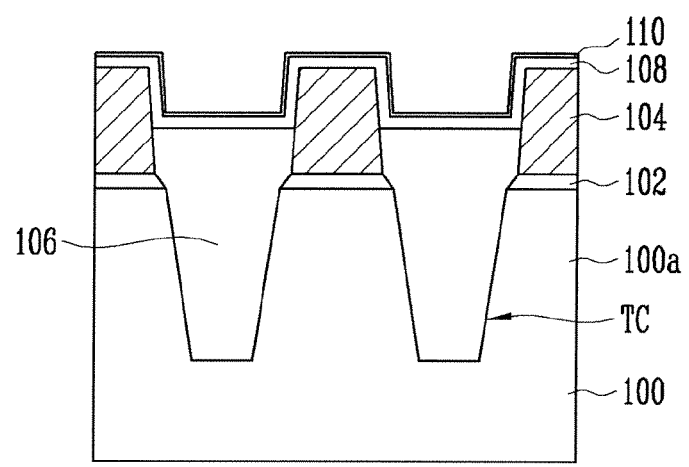

Referring to FIG. 1C, a process of nitrifying the surface of the dielectric layer 108 is performed, and so a nitride layer 110 is formed on the dielectric layer 108. The nitride layer 110 functions to make uniform the grain size of a conductive layer (refer to 112 of FIG. 1D) for a control gate that will be formed later. The process of nitrifying the surface of the dielectric layer 108 preferably is performed using a thermal nitrification process using a nitrogen source gas. The thermal nitrification process is described in detail below.

The thermal nitrification process preferably is performed by supplying the nitrogen source gas into a chamber wherein a temperature within the chamber in a range of about 500° C. to 900° C. and a pressure within the chamber in a range of about 10 Torr to 60 Torr. The thermal nitrification process preferably is performed in-situ using the same chamber as used when the dielectric layer 108 is formed. The thermal nitrification process preferably is performed by supplying the nitrogen source gas into the chamber instead of a nitrification process using plasma.

Any one of $NH_3$ gas, $N_2O$ gas, and NO gas can be used as the nitrogen source gas. From among them, the $NH_3$ gas and the NO gas can easily nitrify the surface of the dielectric layer 108 because they can be easily thermally decomposed.

In the thermal nitrification process, control of the flow rate of the nitrogen source gas and the control of the turn around time are important. If the flow rate of the nitrogen source gas is smaller than an appropriate value, it is difficult to efficiently reduce the grain size of the conductive layer (refer to 112 of FIG. 1D) for a control gate. Meanwhile, if the flow rate of the nitrogen source gas is greater than an appropriate value, the electrical properties of memory cells can deteriorate because nitrogen remaining after a combination of the nitrogen source gas and the dielectric layer 108 can be trapped at the surface of the dielectric layer 108. In particular, in the case in which $NH_3$ gas is used as the nitrogen source gas, if the amount of hydrogen generated when the $NH_3$ gas is thermally decomposed is excessive, the electrical properties of memory cells can be deteriorated.

Accordingly, the thermal nitrification process preferably is performed by supplying the nitrogen source gas into the chamber at the flow rate of 0.1 sccm to 5.0 sccm for about 10 seconds to 1000 seconds. In such a process condition, the surface of the dielectric layer 108 is only nitrified, but how much (i.e., thickness) is the surface of the dielectric layer 108 nitrified cannot be defined. For convenience of description, in this disclosure, the nitrified portion is called the nitride layer 110. Accordingly, the thickness of the nitride layer 110 is not defined to be a numerical value.

Figure 1D:
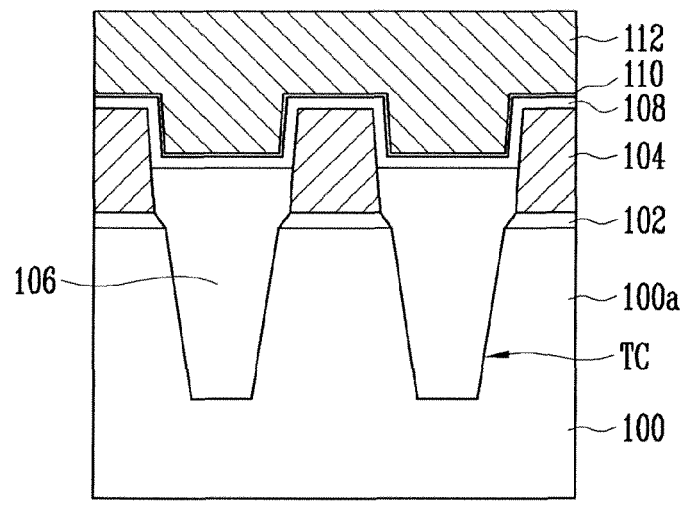

Referring to FIG. 1D, the conductive layer 112 for a control gate is formed over the dielectric layer 108 having a nitrified surface. Next, the conductive layer 112 is patterned to form the control gate. The conductive layer 112 preferably comprises a polysilicon layer, as described in detail below.

The conductive layer 112 preferably is formed using a silicon source gas, an impurity doping gas, and a nitrogen source gas. The silicon source gas is a source gas for forming polysilicon. $Si_xH_y$ gas (where x and y are positive integers) preferably is used as the silicon source gas. For example, any one of $SiH_4$, $Si_2H_6$, and $Si_3H_8$ is a preferred $Si_xH_y$ gas. The impurity doping gas is used to make the control gate have the desired electrical property. For example, $PH_3$ gas is a preferred impurity doping gas. The nitrogen source gas is used to inhibit the grain size of polysilicon from increasing. For example, any one of $NH_3$ gas, $N_2O$ gas, and NO gas is a preferred nitrogen source gas.

To form the conductive layer 112, a temperature within the chamber preferably is set in a range of 500° C. to 900° C. and a pressure within the chamber preferably is set in a range of 10 Torr to 60 Torr. The process of forming the conductive layer 112 can be performed using a process of forming the dielectric layer 108, a process of nitrifying the dielectric layer 108, and an in-situ method. Thus, in the process of nitrifying the dielectric layer 108, the nitrogen source gas is supplied into the chamber. Thus, to form the control gate 112, the silicon source gas and the impurity doping gas are further supplied into the same chamber.

The silicon source gas preferably is supplied into the chamber at a flow rate of 10 sccm to 500 sccm. The impurity doping gas preferably is supplied into the chamber at the flow rate of 10 sccm to 500 sccm. The nitrogen source gas is used to inhibit the grain size of polysilicon from increasing and preferably supplied at the flow rate of 0.1 sccm to 5.0 sccm.

As described above, the conductive layer 112 is formed over the dielectric layer 108 having a nitrified surface. Accordingly, the grain size of the conductive layer 112 becomes small and uniform. Thus, since the nitride layer 110 formed on the surface of the dielectric layer 108 functions to inhibit the grain size of polysilicon from increasing, the grain size of polysilicon can become small and uniform.

Figure 2:
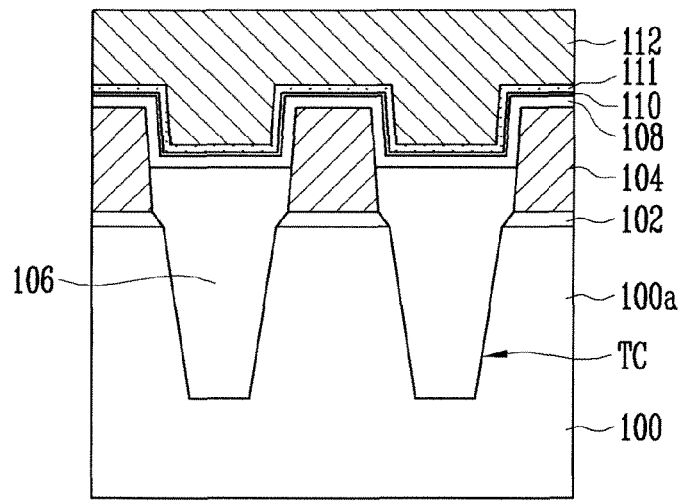
FIG. 2 is a cross-sectional view of a nonvolatile memory device according to another exemplary embodiment of this disclosure.

FIG. 2 is a cross-sectional view of a nonvolatile memory device according to a second exemplary embodiment of this disclosure.

A process of forming a gate insulating layer 102 and a conductive layer 104 to a process of forming a dielectric layer 108 having a nitrified surface are the same as those described with reference to FIGS. 1A to 1C, and a description thereof is omitted.

Next, a silicon seed layer 111 is formed over the dielectric layer 108 having a nitrified surface. The seed layer 111 preferably is formed using a nitrogen source gas and a small amount of a silicon source gas. Thus, the silicon source gas preferably is supplied into the chamber at the flow rate of 1 sccm to 100 sccm at a temperature in a range of 500° C. to 900° C. and a pressure in a range of 10 Torr to 60 Torr. To form the conductive layer 112, an impurity doping gas (e.g., $PH_3$ gas) is further supplied into the chamber. The process of forming the dielectric layer 108 to the process of forming the conductive layer 112 preferably is performed in-situ.

Figure 3:
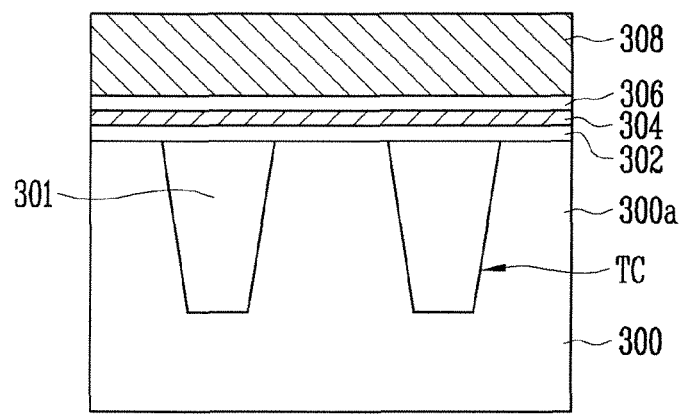
FIG. 3 is a cross-sectional view of a nonvolatile memory device according to yet another exemplary embodiment of this disclosure.

FIG. 3 is a cross-sectional view of a nonvolatile memory device according to a third exemplary embodiment of this disclosure.

This disclosure may also be applied to a nonvolatile memory device having a silicon/oxide/nitride/oxide/silicon (SONOS) structure, for example.

In the memory device of the SONOS structure, a charge trap layer 304 comprises a nitride instead of polysilicon. A method of manufacturing the memory device of the SONOS structure is described in detail below.

In the memory device of the SONOS structure, trenches TC are formed in a semiconductor substrate 300. The trenches TC are filled with insulating materials to form isolation layers 301 in the respective trenches. A gate insulating layer 302 for the direct tunneling of electrons is formed over active regions 300 an and the isolation layers 301. The gate insulating layer 302 preferably comprises an oxide layer. The charge trap layer 304 for trapping charges is formed over the gate insulating layer 302. A charge cut-off layer 306 for cutting off the leakage of electric charges is formed over the charge trap layer 304. The charge cut-off layer 306 preferably comprises a material selected from the group consisting of $Al_2O_3$, $HfO_2$, and $ZrO_2$ or can have a stack structure of at least two of $Al_2O_3$, $HfO_2$, and $ZrO_2$.

Next, a thermal nitrification process of nitrifying a top surface of the charge cut-off layer 306 is performed. The thermal nitrification process preferably is performed in-situ by supplying a nitrogen source gas into the same chamber as used when the charge cut-off layer 306 is formed. Preferably, any one of $NH_3$ gas, $N_2O$ gas, and NO gas can be used as the nitrogen source gas. The $NH_3$ gas or the $N_2O$ gas which can be easily thermally decomposed preferably is used. The thermal nitrification process preferably is performed by supplying the nitrogen source gas at the flow rate of 0.1 sccm to 5.0 sccm for 10 seconds to 1000 seconds a temperature within the chamber in a range of 500° C. to 900° C. and a pressure within the chamber in a range of 10 Torr to 60 Torr. In such a process condition, the surface of the charge cut-off layer 306 is only nitrified, but how much (i.e., thickness) is the surface of the charge cut-off layer 306 nitrified cannot be defined.

A conductive layer 308 for a control gate is formed over the charge cut-off layer 306. The conductive layer 308 preferably is formed using a polysilicon deposition process. The polysilicon deposition process preferably is performed by supplying the nitrogen source gas at a flow rate of 0.1 sccm to 5.0 sccm, the silicon source gas at a flow rate of 10 sccm to 500 sccm, and the impurity doping gas at a flow rate of 10 sccm to 500 sccm at a temperature in a range of 500° C. to 900° C. and a pressure in a range of 10 Torr to 60 Torr.

Prior to the polysilicon deposition process, a silicon seed layer (not shown) preferably is further formed on the nitrified surface of the charge cut-off layer 306 using the nitrogen source gas and the silicon source gas. The process of forming the silicon seed layer preferably is performed by supplying a nitrogen source gas selected from the group consisting of $NH_3$ gas, $N_2O$ gas, and NO gas at a flow rate of 0.1 sccm to 5.0 sccm and a silicon source gas selected from the group consisting of $SiH_4$ gas, $Si_2H_6$ gas, and $Si_3H_8$ gas at a flow rate of 1 sccm to 100 sccm at a pressure in a range of 10 Torr to 60 Torr and a temperature in a range of 500° C. to 900° C.

Since the grain size of the control gate of the nonvolatile memory device is formed small and uniformly as described above, voids can be prevented from occurring in the control gate. Accordingly, a shift in the threshold voltage of a memory cell can be inhibited when the memory cell is operated, and coupling between the floating gate and the control gate can become uniform. Consequently, deterioration of the electrical properties of the nonvolatile memory device can be prevented, and so reliability can be improved.

In accordance with the embodiments of this disclosure, since the control gate is formed using the nitrogen source gas, the silicon source gas, and the impurity doping gas, the grain size of polysilicon forming the control gate can be inhibited from increasing. Accordingly, voids can be prevented from occurring in the control gate. Further, since a reduction in the coupling between the floating gate and the control gate can be prevented, a deterioration of the electrical property of the nonvolatile memory device can be prevented. In addition, in the process of nitrifying the top surface of the dielectric layer, the thermal nitrification process using only the nitrogen source gas is performed without an additional plasma nitrification process. Accordingly, the process can be simplified, and so the turn around time can be reduced.

What is claimed is:

1. A method of manufacturing a nonvolatile memory device, the method comprising:
   providing a semiconductor substrate defining active regions and isolation regions with a gate insulating layer and a floating gate formed over each active region and isolation layer formed in the respective isolation regions;
   forming a dielectric layer on respective surfaces of the isolation layers and the floating gates;
   nitrifying a surface of the dielectric layer through a thermal nitrification process using a first nitrogen source gas;
   forming a polysilicon layer over the dielectric layer through a polysilicon deposition process using a second nitrogen source gas, a silicon source gas, and an impurity doping gas; and
   patterning the polysilicon layer to form a control gate,
   wherein forming the dielectric layer, the thermal nitrification process, and the polysilicon deposition process are performed in-situ.

2. The method of claim 1, comprising forming the dielectric layer and performing the polysilicon deposition process in-situ.

3. The method of claim 1, wherein:
   the nitrogen source gas is selected from the group consisting of $NH_3$ gas, $N_2O$ gas, and NO gas, the silicon source gas is selected from the group consisting of $SiH_4$ gas, $Si_2H_6$ gas, and $Si_3H_8$ gas, and the impurity doping gas comprises $PH_3$ gas.

4. The method of claim 1, comprising performing the polysilicon deposition process by supplying the second nitrogen source gas at a flow rate of 0.1 sccm to 5.0 sccm, the silicon source gas at a flow rate of 10 sccm to 500 sccm, and the impurity doping gas at a flow rate of 10 sccm to 500 sccm at a pressure in a range of 10 Torr to 60 Torr and a temperature in a range of 500° C. to 900° C.

5. The method of claim 1, wherein the dielectric layer has an ONO stack structure of an oxide layer, a nitride layer, and an oxide layer.

6. The method of claim 1, comprising performing the thermal nitrification process by supplying the first nitrogen source gas at a flow rate of 0.1 sccm to 5.0 sccm for 10 seconds to 1000 seconds at a pressure in a range of 10 Torr to 60 Torr and a temperature in a range of 500° C. to 900° C.

7. The method of claim 1, further comprising forming a silicon seed layer on a surface of the dielectric layer using the nitrogen source gas and the silicon source gas prior to performing the polysilicon deposition process.

8. The method of claim 7, comprising forming the dielectric layer, forming the silicon seed layer, and performing the polysilicon deposition process in-situ.

9. The method of claim 7, wherein:
   the nitrogen source gas is selected from the group consisting of $NH_3$ gas, $N_2O$ gas, and NO gas, and the silicon source gas is selected from the group consisting of $SiH_4$ gas, $Si_2H_6$ gas, and $Si_3H_8$ gas.

10. The method of claim 7, comprising forming the silicon seed layer by supplying the nitrogen source gas at a flow rate of 0.1 sccm to 5.0 sccm and the silicon source gas at a flow rate of 1 sccm to 100 sccm at a temperature in a range of 500° C. to 900° C. and a pressure in a range of 10 Torr to 60 Torr.

11. A method of manufacturing a nonvolatile memory device, the method comprising:
   providing a semiconductor substrate defining active regions and isolation regions with a gate insulating layer and a charge trap layer formed over each active region and isolation layer formed in the respective isolation regions;
   forming a charge cut-off layer over the charge trap layer;
   nitrifying a surface of the charge cut-off layer by a thermal nitrification process using a nitrogen source gas;
   forming a polysilicon layer over the nitrified charge cut-off layer by a polysilicon deposition process using the nitrogen source gas, a silicon source gas, and an impurity doping gas; and
   patterning the polysilicon layer to form a control gate,
   wherein forming the charge cut-off layer, the thermal nitrification process, and the polysilicon deposition process are performed in-situ.

12. The method of claim 11, wherein:
   the charge trap layer comprises a nitride, and the charge cut-off layer comprises a material selected from the group consisting of $Al_2O_3$, $HfO_2$, and $ZrO_2$ or has a stack structure including at least two of $Al_2O_3$, $HfO_2$, and $ZrO_2$.

13. The method of claim 11, wherein:
   the nitrogen source gas is selected from the group consisting of $NH_3$ gas, $N_2O$ gas, and NO gas, the silicon source gas is selected from the group consisting of $SiH_4$ gas, $Si_2H_6$ gas, and $Si_3H_8$ gas, and the impurity doping gas comprises $PH_3$ gas.

14. The method of claim 11, comprises performing the thermal nitrification process by supplying the nitrogen source gas at a flow rate of 0.1 sccm to 5.0 sccm for 10 seconds to 1000 at a temperature in a range of 500° C. to 900° C. and a pressure in a range of 10 Torr to 60 Torr.

15. The method of claim 11, comprising performing the polysilicon deposition process by supplying the nitrogen source gas at a flow rate of 0.1 sccm to 5.0 sccm and the silicon source gas at a flow rate of 10 sccm to 500 sccm at a temperature in a range of 500° C. to 900° C. and a pressure in a range of 10 Torr to 60 Torr.

16. The method of claim 11, further comprising forming a silicon seed layer on a surface of the nitrified charge cut-off layer using the nitrogen source gas and the silicon source gas prior to performing the polysilicon deposition process.

17. The method of claim 16, comprising forming the silicon seed layer by supplying a nitrogen source gas selected from the group consisting of $NH_3$ gas, $N_2O$ gas, and NO gas at a flow rate of 0.1 sccm to 5.0 sccm and a silicon source gas selected from the group consisting of $SiH_4$ gas, $Si_2H_6$ gas, and $Si_3H_8$ gas at a flow rate of 1 sccm to 100 sccm at a temperature in a range of 500° C. to 900° C. and a pressure in a range of 10 Torr to 60 Torr.

* * * * *